(12) United States Patent
Flagello

(10) Patent No.: US 7,952,803 B2
(45) Date of Patent: May 31, 2011

(54) LITHOGRAPHIC APPARATUS AND DEVICE MANUFACTURING METHOD

(75) Inventor: Donis George Flagello, Scottsdale, AZ (US)

(73) Assignee: ASML Netherlands B.V., Veldhoven (NL)

( * ) Notice: Subject to any disclaimer, the term of this patent is extended or adjusted under 35 U.S.C. 154(b) by 1027 days.

(21) Appl. No.: 11/433,768

(22) Filed: May 15, 2006

(65) Prior Publication Data

US 2007/0263269 A1   Nov. 15, 2007

(51) Int. Cl.
*G02B 27/46* (2006.01)
*H01L 21/30* (2006.01)

(52) U.S. Cl. ............. 359/569; 359/565; 355/53; 355/67

(58) Field of Classification Search .................. 359/569, 359/566, 565; 353/53, 67
See application file for complete search history.

(56) References Cited

U.S. PATENT DOCUMENTS

| | | | |
|---|---|---|---|
| 4,560,249 A | 12/1985 | Nishiwaki et al. | |
| 4,596,467 A | 6/1986 | Bartelt | |
| 4,792,197 A | 12/1988 | Inoue et al. | |
| 4,806,454 A | 2/1989 | Yoshida et al. | |
| 5,142,385 A | 8/1992 | Anderson et al. | |
| 5,386,319 A * | 1/1995 | Whitney | 359/575 |
| 5,392,119 A | 2/1995 | McArthur et al. | |
| 5,415,835 A | 5/1995 | Brueck et al. | |
| 5,621,497 A * | 4/1997 | Terasawa et al. | 355/53 |
| 5,640,239 A | 6/1997 | Takamiya et al. | |
| 5,705,321 A | 1/1998 | Brueck et al. | |
| 5,715,089 A * | 2/1998 | Shiraishi | 359/558 |
| 5,759,744 A | 6/1998 | Brueck et al. | |
| 5,771,098 A | 6/1998 | Ghosh et al. | |
| RE36,113 E | 2/1999 | Brueck et al. | |
| 5,895,741 A * | 4/1999 | Hasegawa et al. | 430/5 |
| 6,013,396 A | 1/2000 | Capodieci | |
| 6,115,345 A * | 9/2000 | Kato et al. | 369/112.1 |
| 6,178,000 B1 | 1/2001 | Hoffnagle | |
| 6,185,019 B1 | 2/2001 | Hobbs et al. | |
| 6,233,044 B1 | 5/2001 | Brueck et al. | |
| 6,285,443 B1 | 9/2001 | Wangler et al. | |
| 6,304,318 B1 | 10/2001 | Matsumoto | |
| 6,556,280 B1 | 4/2003 | Kelsey et al. | |

(Continued)

FOREIGN PATENT DOCUMENTS

DE   3682675   1/1992

(Continued)

OTHER PUBLICATIONS

Office Action in related application JP2007-120705 mailed May 25, 2010.

(Continued)

*Primary Examiner* — Audrey Y Chang
(74) *Attorney, Agent, or Firm* — Pillsbury Winthrop Shaw Pittman LLP

(57) ABSTRACT

A lithographic apparatus includes a first diffraction grating configured to create a first plurality of spatially coherent radiation beams and a second diffraction grating configured to receive at least a portion of the first plurality of spatially coherent radiation beams and to create, based on the first plurality of spatially coherent radiation beams, a second plurality of spatially coherent radiation beams. The apparatus also includes a beam combiner adapted to redirect and combine at least a portion of the second plurality of spatially coherent radiation beams onto a surface of a substrate to form an interference pattern.

21 Claims, 8 Drawing Sheets

U.S. PATENT DOCUMENTS

| | | | |
|---|---|---|---|
| 6,700,700 B2 * | 3/2004 | Goldstein | 359/361 |
| 6,830,850 B1 | 12/2004 | Krivokapic et al. | |
| 6,882,477 B1 | 4/2005 | Schattenburg et al. | |
| 7,170,588 B2 * | 1/2007 | Smith | 355/71 |
| 7,232,982 B2 * | 6/2007 | Takami | 250/208.1 |
| 7,443,482 B2 * | 10/2008 | Novak et al. | 355/30 |
| 2001/0021487 A1 | 9/2001 | Williams et al. | |
| 2001/0035991 A1 | 11/2001 | Hobbs et al. | |
| 2002/0030802 A1 | 3/2002 | Sugita et al. | |
| 2002/0031725 A1 | 3/2002 | Sugita et al. | |
| 2002/0134985 A1 | 9/2002 | Chen et al. | |
| 2002/0149751 A1 | 10/2002 | Bloomstein et al. | |
| 2002/0149757 A1 | 10/2002 | Kelsey et al. | |
| 2002/0149849 A1 | 10/2002 | Kelsey et al. | |
| 2003/0098979 A1 | 5/2003 | Dress et al. | |
| 2003/0147082 A1 | 8/2003 | Goldstein | |
| 2004/0042724 A1 | 3/2004 | Gombert et al. | |
| 2004/0110092 A1 | 6/2004 | Lin | |
| 2005/0012933 A1 | 1/2005 | Matthews | |
| 2005/0057735 A1 | 3/2005 | Smith | |
| 2005/0064297 A1 | 3/2005 | Wago | |
| 2005/0073671 A1 | 4/2005 | Borodovsky | |
| 2005/0074698 A1 * | 4/2005 | Borodovsky | 430/312 |
| 2005/0088633 A1 | 4/2005 | Borodovsky | |
| 2005/0094152 A1 | 5/2005 | Allen | |
| 2005/0105100 A1 | 5/2005 | Swindal | |
| 2005/0168717 A1 | 8/2005 | Hinsberg, III et al. | |

FOREIGN PATENT DOCUMENTS

| | | |
|---|---|---|
| JP | 03-263313 A | 11/1991 |
| JP | 04-343215 A | 11/1992 |
| JP | 08-316125 | 11/1996 |
| JP | 10-209004 | 8/1998 |
| JP | 10-209004 A | 8/1998 |
| JP | 2000/021720 | 1/2000 |
| JP | 2000-171706 | 6/2000 |
| JP | 2000-223400 | 8/2000 |
| JP | 2001-509904 T | 7/2001 |
| JP | 2001/223149 | 8/2001 |
| JP | 2005/134873 | 5/2005 |
| JP | 2006-066919 A | 3/2006 |
| JP | 2006066919 A | 3/2006 |
| KR | 9401227 B1 | 2/1994 |
| WO | 98/18049 A1 | 4/1998 |
| WO | 2004/003611 A1 | 1/2004 |
| WO | 2004/088363 A1 | 10/2004 |
| WO | 2004/317922 | 11/2004 |

OTHER PUBLICATIONS

Office action in related Japanese application No. 2007-120705 mailed Nov. 26, 2010.

* cited by examiner

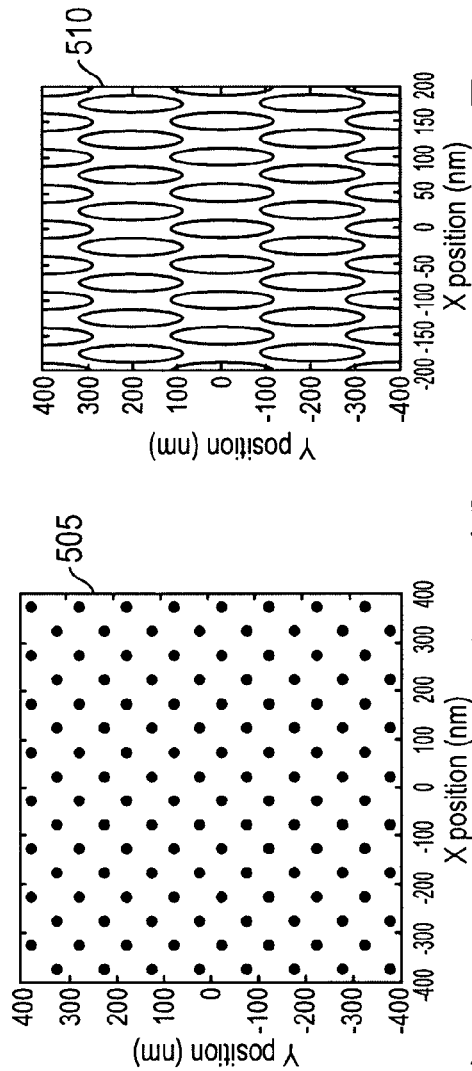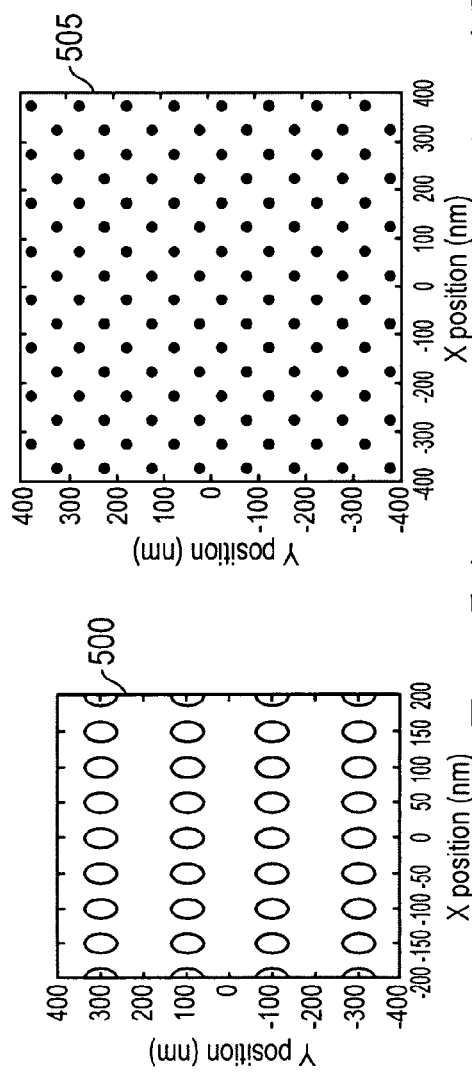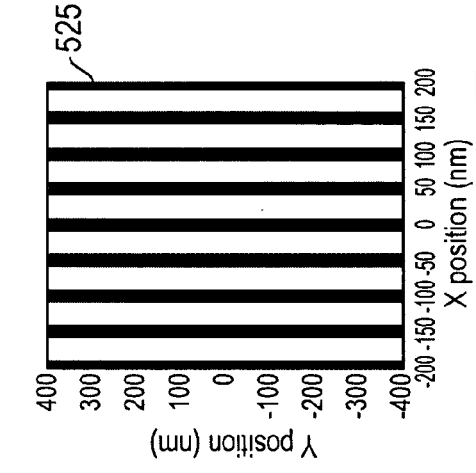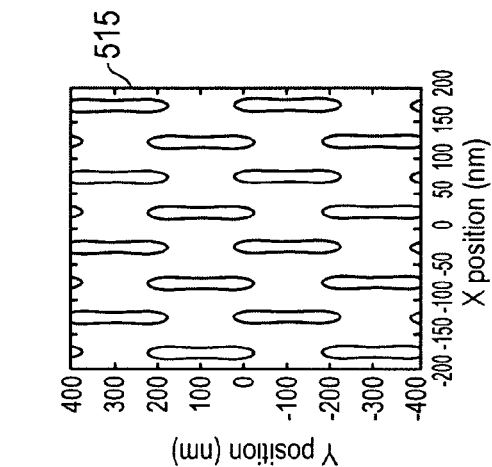
Fig. 5A  Fig. 5B  Fig. 5C
Fig. 5D  Fig. 5E  Fig. 5F

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size of a feature arranged in an array with a 1:1 duty cycle (i.e., equal lines and spaces or holes with size equal to half the pitch). Thus, in the context of an array of features characterized by a certain pitch at which the features are spaced in the array, the critical dimension CD in equation (1) represents the value of half of a minimum pitch that can be printed, referred to hereinafter as the "half-pitch."

It follows from equation (1) that a reduction of the minimum printable size of features can be obtained in three ways: by shortening the exposure wavelength $\lambda$, by increasing the numerical aperture $NA_{PS}$ or by decreasing the value of $k_1$.

Current resolution enhancement techniques that have been extensively used in lithography to lower the Rayleigh constant $k_1$, thereby improving the pattern resolution, include the use of, for example, attenuated or alternating phase shift masks and/or sub-resolution assist features (SRAF). These resolution enhancement techniques are of particular importance for lithographic printing and processing of contact holes or vias which define connections between wiring levels in an IC device, because contact holes have, compared to other IC features, a relatively small area. Contact holes may be printed, for example, using conventional on-axis illumination in combination with a phase shift mask and a positive resist.

However, the use of attenuated or alternating phase shift masks and/or sub-resolution assist features may not be feasible to pattern small features and contact holes below about 85 nm (at $\lambda$=193 nm, $NA_{PS}$=0.93, and $k_1$=0.4). These techniques have limited capabilities and may not provide sufficient process latitude (i.e., the combined usable depth of focus and allowable variance of exposure dose for a given tolerance in the critical dimension) to print half-pitches below a CD obtainable when operating at $k_1$=0.4.

SUMMARY

In an embodiment of the invention, there is provided a lithographic apparatus including a first beam splitter configured to create a first plurality of spatially coherent radiation beams; a second beam splitter configured to receive at least a portion of the first plurality of spatially coherent radiation beams and to create, based on the first plurality of spatially coherent radiation beams, a second plurality of spatially coherent radiation beams; and a beam combiner adapted to redirect and combine at least a portion of the second plurality of spatially coherent radiation beams onto a surface of a substrate to form an interference pattern.

In another embodiment of the invention, there is provided a lithographic apparatus including a first diffraction grating configured to create a first plurality of spatially coherent radiation beams; a second diffraction grating configured to receive at least a portion of the first plurality of spatially coherent radiation beams and to create, based on the first plurality of spatially coherent radiation beams, a second plurality of spatially coherent radiation beams; a radiation transfer device arranged between the first and the second diffraction gratings, the radiation transfer device configured to redirect the portion of the first plurality of spatially coherent radiation beams towards the second diffraction grating such that the first plurality of spatially coherent radiation beams form a coherent off-axis illumination for the second diffraction grating; and a beam combiner adapted to redirect and combine at least a portion of the second plurality of spatially coherent radiation beams onto a surface of a substrate to form an interference pattern.

In yet another embodiment of the invention, there is provided a device manufacturing method including illuminating a first diffraction grating with a beam of radiation so as to form a first plurality of spatially coherent radiation beams; illuminating a second diffraction grating with at least a portion of the first plurality of spatially coherent radiation beams so as to form a second plurality of spatially coherent radiation beams; and redirecting and combining at least a portion of the second plurality of spatially coherent radiation beams onto a surface of a substrate so as to form an interference pattern.

In an embodiment of the invention, there is provided a method for configuring an optical transfer of a layout of a patterning device onto a substrate, the layout including periodic and non-periodic patterns, the method including forming a first and a second sub-layout with respectively, the periodic and non-periodic patterns of the layout of the patterning device; transferring an image of the first sub-layout onto the substrate with an interferometric lithographic apparatus; and transferring an image of the second sub-layout onto the substrate without an interferometric lithographic apparatus.

In another embodiment of the invention, there is provided a lithographic apparatus including a beam splitter configured to create at least four spatially coherent radiation beams that propogate in different directions, and a beam combiner configured to redirect and combine the at least four spatially coherent radiation beams that propagate in different directions onto a surface of a substrate so as to form an interference pattern.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5A-F show periodic patterns that are formed with a four beam interference process (FIGS. 5A-E) and a two beam interference process (FIG. 5F) using the lithographic apparatus of FIG. 1A;

DETAILED DESCRIPTION

Figure 1A:
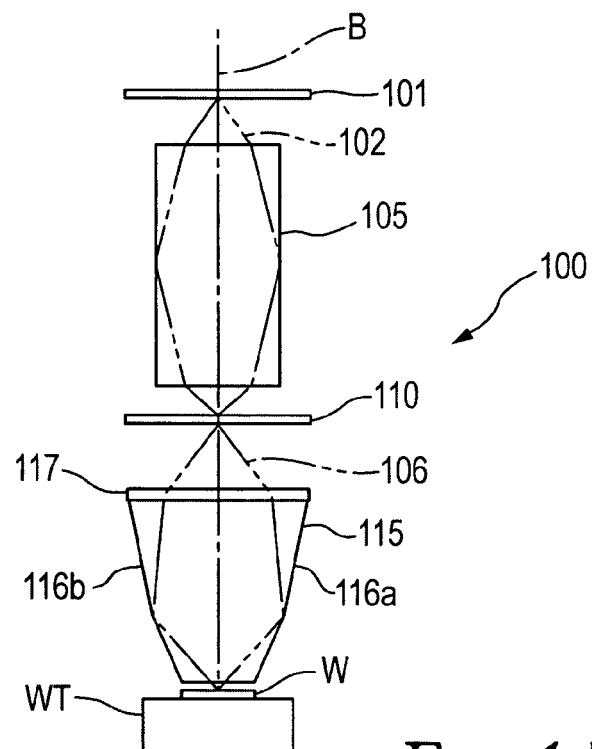
FIG. 1A schematically depicts a lithographic apparatus in accordance with an embodiment of the invention.

FIG. 1A shows a lithographic apparatus 100 in accordance with an embodiment of the invention. The apparatus 100 generally includes a first beam splitter 101, a radiation transfer device 105, a second beam splitter 110 and a combiner 115. The first beam splitter 101 is configured to generate a plurality of spatially coherent beams 102 when illuminated by a coherent beam of radiation B. The plurality of beams 102 are then incident on the radiation transfer device 105, which is adapted to redirect at least a portion of them to the second beam splitter 110. The second beam splitter 110 generates a plurality of beams 106 that are redirected toward a substrate W via reflecting surfaces 116a-b of the combiner 115. In FIG. 1A, the radiation transfer device 105 is adapted to redirect at least a portion of the plurality of spatially coherent beams 102 to the second beam splitter 110. In an embodiment, the radiation transfer device 105 is adapted to redirect substantially all of the plurality of beams 102 to the second beam splitter 110.

The plurality of beams 106 create an interference pattern at the upper surface of the substrate W. The interference pattern exposes a photoresist layer (not shown in FIG. 1A), which forms a grating pattern. The interference pattern includes fringes of maximum intensity formed by constructive interference of the plurality of beams 106. The fringes are separated by zones of minimum intensity that are caused by destructive interference of the plurality of beams 106.

The beam of radiation B is generated by a radiation source (not shown in FIG. 1A), which may emit in the UV, deep UV or extreme UV range. In one configuration, the radiation has a wavelength of about 193 nm. Lithographic apparatus 100 may also include a polarizer positioned between the source of radiation and the first beam splitter 101 to polarize the beam of radiation B. In one configuration, the polarizer is adapted to create a TE polarization.

The substrate W is supported by a substrate table WT that is configured to move the substrate W with respect to the first and second beam splitters 101, 110, the radiation transfer device 105 and the beam combiner 115. The lithographic apparatus can be adapted to operate in step mode or in scan mode. In step mode, the second beam splitter 110 (and the support structure that supports the second beam splitter 110) and the substrate table WT are kept essentially stationary during exposure of a target portion of the substrate. The substrate table WT is then translated so that a different target portion can be exposed. In scan mode, the second beam splitter 110 and the substrate table WT are scanned synchronously during exposure of a target portion of the substrate (i.e. a single dynamic exposure).

As shown in FIG. 1A, the radiation transfer device 105 is adapted to collect at least a portion of the plurality of beams 102 generated by the beam splitter 101 and to redirect them to the second beam splitter 110. In one configuration, the radiation transfer device 105 takes the form of a light pipe, such as a glass, calcium fluoride or quartz rod. However, it will be appreciated that alternative mechanisms could be used to redirect the plurality of beams 102. For example, the radiation transfer device 105 may include a plurality of mirrors or a lens that is adapted to redirect the beams 102 toward the second beam splitter 110.

In an embodiment, as shown in FIG. 1A, the first and second beam splitters 101, 110 are diffraction gratings that generate diffraction order beams 102 and 106, respectively. The first and second beam splitters 101 and 110 are one or two dimensional diffraction gratings. An example of diffraction gratings that can be used to form the interference pattern includes a glass plate with a checkerboard grating. The grating can be a phase shift mask grating or a binary grating. In various configurations, gratings 101, 110 include a glass plate with a chrome checkerboard pattern, an etched phase pattern, a chrome basket weave pattern or an etched weave pattern.

The first beam splitter or diffraction grating 101 is configured to create a spatially coherent off-axis illumination for the second diffraction grating 110. In this configuration, the first and second gratings 101, 110 act, respectively, as a spatially coherent off-axis illumination source grating and an imaging grating.

Coherence is a measure of the correlation that exists between the phases of the radiation wave measured at different points in the beam of radiation. Coherence of a beam of radiation can be described in terms of temporal coherence and spatial coherence.

Temporal coherence is the measure of the correlation between the phases of a radiation wave at different positions along the direction of propagation. Temporal coherence is an indicator as to how monochromatic a radiation source is. For example, if the radiation source emits radiation with a wavelength $\lambda+\Delta\lambda$, radiation waves with wavelength $\lambda$ and $\lambda+\Delta\lambda$ will destructively interfere after the radiation waves propagate farther than a specific optical path length generally denoted as Lc. Lc may be referred to as the coherence length of the radiation source. Interference patterns between two waves cannot be observed if the optical path difference between the waves exceeds Lc.

Spatial coherence is a measure of the correlation between the phases of a radiation wave at different points transverse to the direction of propagation. Spatial coherence indicates how uniform the phase of the wave front is. In order to create interferences, there must be some spatial coherence between the radiation waves. In other words, a fixed phase relationship between the radiation waves must be maintained. In the embodiment of FIG. 1A, a fixed phase relationship exists between the diffraction order beams 102 generated by the first beam splitter or first grating 101. As a result, the diffraction order beams 102 together form a spatially coherent illumination source that illuminates the second beam splitter or second grating 110.

In the embodiment of FIG. 1A, the diffraction order beams 102 form an off-axis source that mimics off-axis sources that are used in conventional lithographic apparatus to improve resolution and depth of focus. The off-axis illumination generated by the beams 102 improves resolution and depth of focus by allowing the first order diffracted beam and the zeroth order beam emanating from the second diffraction grating 110 to be simultaneously captured by the beam combiner 115. In other words, with the configuration of FIG. 1A, a plurality of radiation beams (corresponding to diffraction order beams) can be simultaneously captured by the beam combiner 115. By increasing the number of interfering beams at the surface of the substrate, complex interference patterns can be generated.

Figure 2A:
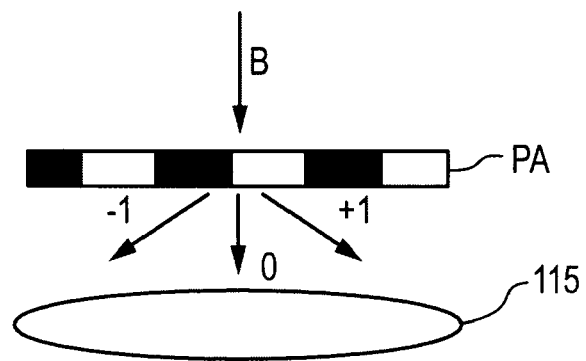
FIGS. 2A-C are schematic illustrations showing the diffraction orders collected by a beam combiner (or a magnification system) for a pattern with a large pitch (FIG. 2A), a pattern with a small pitch (FIG. 2B), and a pattern with a small pitch illuminated by off-axis illumination (FIG. 2C)

Thus, referring to FIG. 2A, when a pattern PA of any grating is illuminated with a coherent beam of radiation, it generates a diffraction pattern and the angles at which the radiation is diffracted are determined by the spatial frequency components of the pattern. For example, an infinite line/space pattern which has a single spatial frequency defined by the pitch P of the line/space pattern diffracts coherent radiation (traveling to the pattern along the optical axis) in a direction perpendicular to the lines and spaces of the pattern at angles (or diffraction orders n, where n is an integer) that are defined by the following equation (2):

$$\theta = \sin^{-1}\{\lambda/(n*P)\} \quad (2)$$

In FIG. 1A, an ideal beam combiner 115 (or an ideal optical magnification system that would be positioned between the grating 110 and the beam combiner 115) would capture all of the diffraction order beams generated by the grating 110 and recombine them to form the desired interference pattern. In reality, the beam combiner 115 (or the optical magnification system) has a finite angle over which it can capture the diffracted beams and any diffracted radiation beyond this angle is lost. This leads to a degraded interference pattern in FIG. 1A.

Figure 2B:
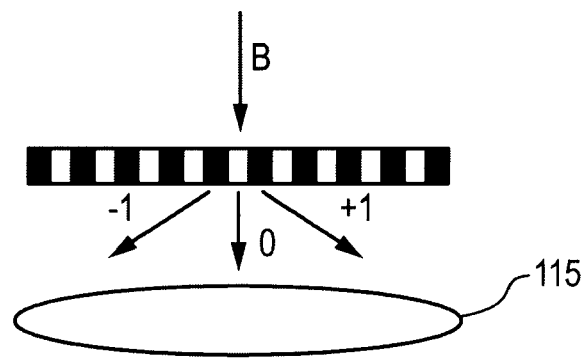

As such, as illustrated in FIGS. 2A and 2B, if a line/space pattern PA is illuminated with a coherent beam of radiation B along the optical axis of the beam combiner 115, the minimum pitch ($P_{min}$) as present in the image at wafer level that would still allow for the +/−1 diffraction order to be captured by the beam combiner 115 can be expressed by:

$$P_{min} = \lambda/NA \quad (3)$$

where $\lambda$ is a wavelength of the radiation B and NA is the numerical aperture of the beam combiner 115.

As shown in FIG. 2A, which illustrates a pattern PA having a pitch $P_{min}$, and FIG. 2B, which illustrates a pattern having a pitch smaller than $P_{min}$, as the pitch is reduced, it is no longer possible for the beam combiner 115 to capture either the +/−1 diffraction order.

Figure 2C:
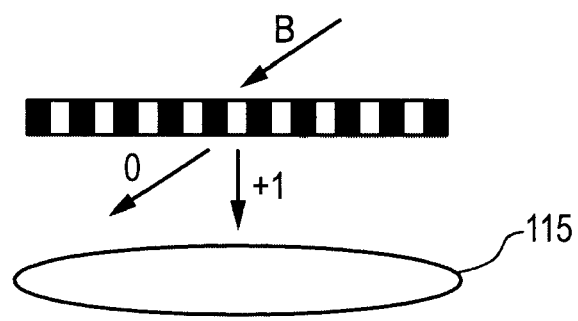

However, referring to FIG. 2C, if the coherent beam B is tilted with respect to the optical axis (off axis illumination or OAI) out to the angular edge capture range of the beam combiner 115, the +1 diffraction order could then be captured by the projection system.

As such, by using an off-axis illumination for the second grating 110, the combiner 115 is able to capture multiple beams (i.e., non-zeroth diffraction orders) produced by the second grating 110 even at tight pitches. In addition, since the off-axis illumination is formed by spatially coherent beams, the diffracted beams 106 generated by the second grating 110 will also be spatially coherent, and thus will be able to interfere to create interference patterns at the surface of the substrate W. As such, it is possible to create a sharper image and to significantly increase the depth of focus of the apparatus 100.

Figure 3:
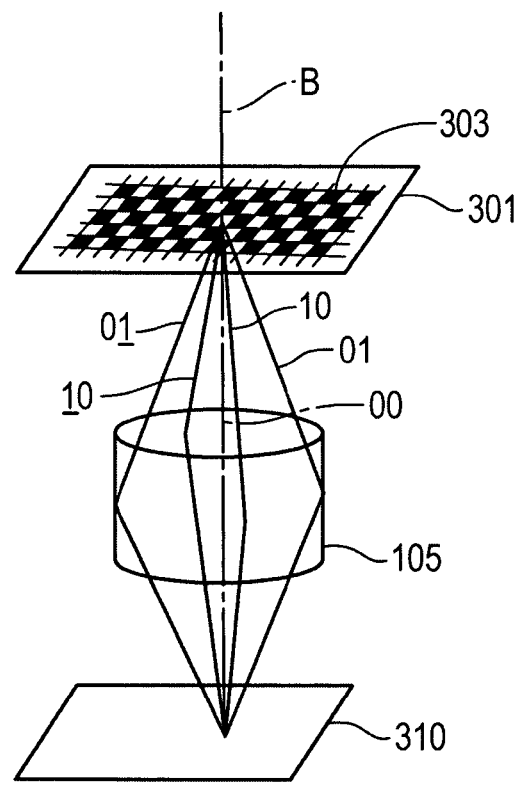
FIG. 3 shows a configuration of a beam splitter in accordance with an embodiment of the invention.

FIG. 3 shows the first beam splitter 301 in accordance with an embodiment of the invention. The first beam splitter 301 includes a two dimensional pattern 303 that takes the form of an array of contacts. When the spatially and temporally coherent beam of radiation B is incident on the first beam splitter 301, a diffraction pattern is generated for each contact. Only the beams that are collected and redirected by the radiation transfer device 105 are illustrated in FIG. 3. However, it will be appreciated that the radiation transfer device 105 may be configured to redirect additional beams. These beams include the zeroth non diffracted order (00) and the first diffracted order. The first diffracted order includes positive orders (10) and (01) and negative orders $(\overline{10})$ and $(\overline{01})$. The four spatially and temporally coherent beams formed by the first beam splitter 301 illuminate the second beam splitter 310. When illuminated, the second beam splitter 310 creates beams (e.g., diffraction order beams) that are redirected to the substrate W via the beam combiner 115, as shown in FIG. 1A.

In the embodiment of FIG. 3, the first beam splitter 301 and the radiation transfer device 105 are adapted to create a quadrupole illumination for the second beam splitter 310. The quadrupole illumination is an off-axis illumination that includes four beams that are each positioned at a substantially equal distance from the optical axis of the lithographic apparatus 100. The angular radius between two adjacent beams (as viewed in a plane substantially perpendicular to the optical axis of the lithographic apparatus 100) is about 90°. It will be appreciated that additional types of illumination may be obtained in other embodiments of the invention. In one configuration, for example, a dipole illumination, i.e., an illumination that includes two off-axis illumination beams, could be obtained. Similarly to the quadrupole illumination, a dipole illumination is an off-axis illumination that includes two beams that are each positioned at a substantially equal distance from the optical axis of the lithographic apparatus 100. The angular radius between the two beams (as viewed in a plane substantially perpendicular to the optical axis of the lithographic apparatus 100) is about 180°. The dipole illumination could be created by, for example, collecting the first diffraction orders of a one dimensional grating. Alternatively, the dipole illumination could be created by, for example, masking two of the first diffraction orders that are generated by the two dimensional beam splitter 301 (e.g., (01) and (01)). Masking could occur either between the beam splitter 301 and the radiation transfer device 105 or between the radiation transfer device 105 and the second beam splitter 310. In another embodiment of the invention, more than four beams could be used to illuminate the second beam splitter 310. In this embodiment, the radiation transfer device 105 could be used, for example, to collect the first and the second diffraction orders generated by the beam splitter 301. In an embodiment, a plurality of diffraction orders are collected and redirected to form an annular illumination on the second beam splitter. Additional types of illumination are contemplated in other embodiments of the invention (e.g., a combination of on-axis and off axis illumination, a bullseye illumination, etc.).

The second beam splitter 310 may be a one or a two dimensional grating. The diffraction beams created by the second grating 310 interfere at the surface of the substrate W to create the interference pattern. The interference fringes that are created on the substrate W are the result of the combined configuration, among other things, of the first and second beam splitters 101, 110 or 301, 310. In an embodiment of the invention, the features of first and second beam splitters 101, 110 or 301, 310 are determined simultaneously to obtain the desired pattern on the substrate. This may be done by optical simulation using inverse coherent imaging. With this method, the pitch, type of grating (e.g., alternating phase shift or a binary grating), and/or the dimension of the pattern of each grating are simultaneously configured to obtain the desired pattern on the substrate. It will also be appreciated that additional parameters can be configured during the inverse coherent imaging process. For example, in an embodiment, the features of the radiation transfer device 105 and/or the combiner 115 could also be part of the configuration. In particular, the dimensions and orientations of the facets of the combiner 115, the radiation wavelength, the index of refraction of the medium in which the beam of radiation B propagates (from the source to the substrate W) and the distance between the components of the lithographic apparatus 100 and the substrate W could also be part of the configuration.

Referring back to FIG. 1A, at least a portion of the plurality of beams 106 generated by the second beam splitter 110 enter the combiner 115 and internally reflect off one of the surfaces (surfaces 116a-b in FIG. 1A) of the combiner. The beams 106 then form the interference fringes on the substrate W. The combiner 115 of FIG. 1A is a multi-faceted prism. A benefit of using a prism such as shown in FIG. 1A, is that that there are no alignment difficulties, once the prism is manufactured. In FIG. 1A, the beam combiner 115 is adapted to redirect at least a portion of the plurality of beams 106 generated by the second beam splitter 110. In an embodiment, the beam combiner 115 is adapted to redirect substantially all of the1 plurality of beams 106 generated by the second beam splitter 110.

Figure 4A:
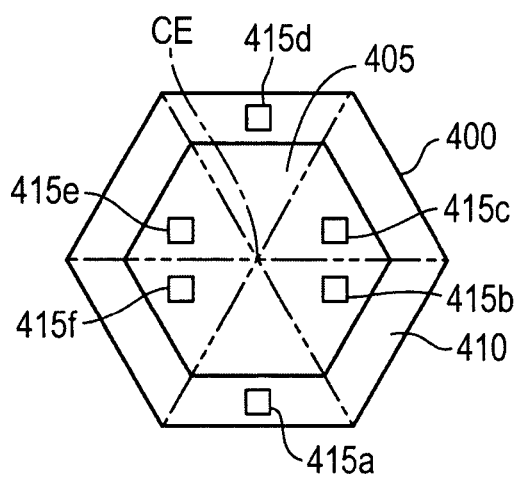
FIGS. 4A-B show, respectively, end views of a hexagonal beam combiner and a square beam combiner in accordance with an embodiment of the invention.
Figure 4B:
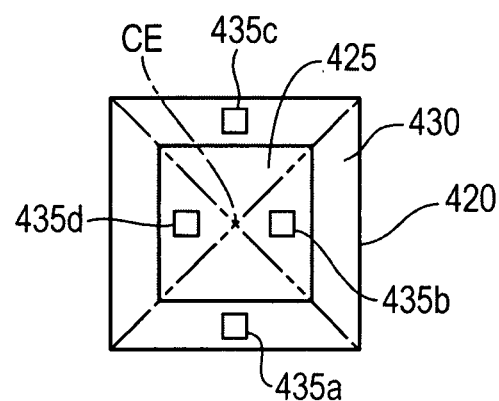

The prism of FIG. 1A may be generalized to have N-way symmetry. For example, in one configuration, the prism may have a six-way symmetry (hexagonal prism), as shown in FIG. 4A. This figure shows an end view of a hexagonal prism in accordance with an embodiment of the invention. The prism 400 includes six high angle zones 405 and six low angle zones 410 that are distributed around the center CE of the prism. In FIG. 4A, the prism 400 is adapted to combine six beams 415a-f in order to form the interference fringes at the surface of the substrate W. The hexagonal prism 400 may be used to create a DRAM type structure. Alternatively, the multi-faceted combiner 115 could have four way symmetry (square prism), as shown in FIG. 4B. The square prism 420 of FIG. 4B includes four high angle zones 425 and four low angle zones 430 that are distributed around the center CE. In FIG. 4B, the prism 420 is adapted to combine four beams 435a-d. It will be appreciated that the design of the prism is not limited to that shown in FIGS. 4A-B and that the number N need not be an even number. For example, three way or five way symmetry could also be used in other embodiments of the invention. In one configuration, the beam combiner 115 of FIG. 1A is adapted to combine between about 2 to 8 beams in order to form the interference pattern.

The typical dimension of the combiner 115 is approximately less than 50 cm at the top face 117 (see FIG. 1A). In one embodiment, the diameter of the top face 117 of the combiner 115 may be in the range from about 20 to 30 cm.

Figure 1B:
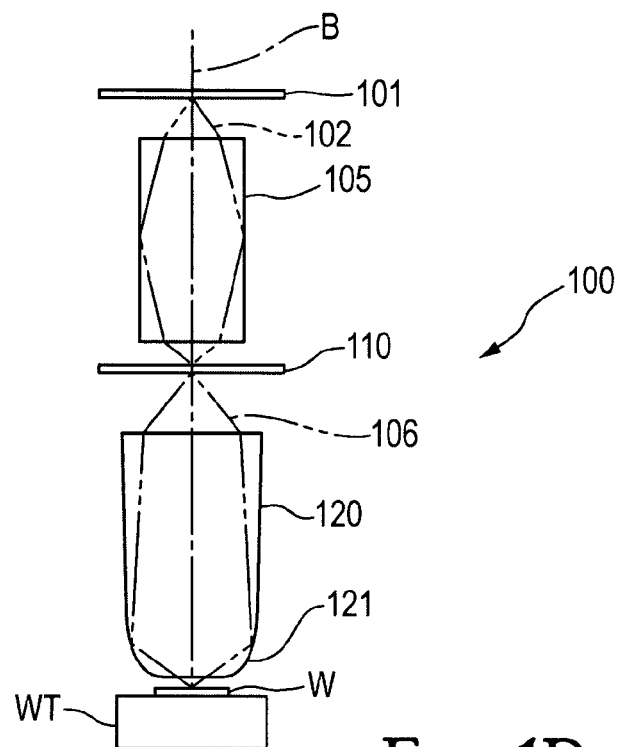
FIG. 1B schematically depicts a lithographic apparatus in accordance with an embodiment of the invention.

It will be appreciated that the combiner 115 is not limited to a multi-faceted prism as shown in FIG. 1A. For example, in the embodiment shown in FIG. 1B, the lithographic apparatus 100 may include a combiner 120 that includes a curved lower surface 121 adapted to reflect off the plurality of beams 106.

In an embodiment, a pattern resolution or half-pitches of about 35 to 40 nm (corresponding to a minimum pitch of about 70-80 nm) can be obtained with the lithographic apparatus of FIG. 1A. Examples of patterns that can be obtained with lithographic apparatus 100 are shown in FIGS. 5A-F.

FIGS. 5A-F show simulated periodic cells 500-525 that can be obtained in accordance with an embodiment of the invention. Cells containing contacts (FIGS. 5B and 5E), trenches (FIG. 5C), short lines (FIGS. 5A and 5D) or straight lines (FIG. 5F) can be formed. Cells 500-520 (FIGS. 5A-E) are formed with a four beam interference process and cell 525 (FIG. 5F) is formed with a two beam interference process.

Figure 6:
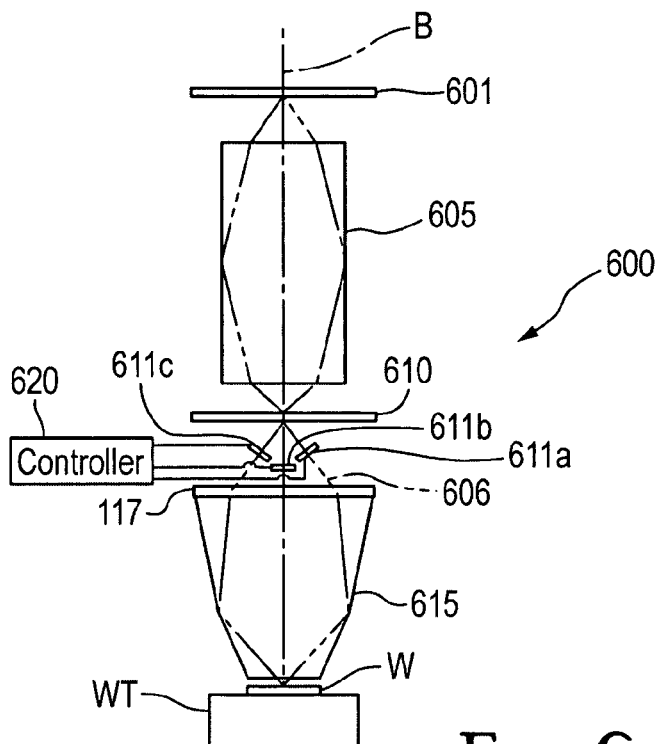
FIG. 6 schematically depicts a lithographic apparatus in accordance with an embodiment of the invention.

In order to adjust the phase and/or amplitude of each or a group of the plurality of beams 106 generated by the second beam splitter 110, one or more attenuators and phase plates can be positioned between the second beam splitter 110 and the combiner 115. The use of such plates and attenuators allows for good control of the interference fringes generated at the surface of the substrate W. Thus, by changing the phase and/or amplitude of one or more of the interfering beams relative to the other(s), the dimensions and the sharpness of the interference fringes can be adjusted. FIG. 6 shows a lithographic apparatus 600 that is adapted to adjust the phases and/or amplitudes of the beams 606 formed by the second beam splitter 610, in accordance with an embodiment of the invention. Lithographic apparatus 600 is similar to lithographic apparatus 100 and includes a first beam splitter 601, a radiation transfer device 605, a second beam splitter 610 and a multifaceted beam combiner 615. Lithographic apparatus 600 also includes plates 611a-c that are inserted in the radiation path of the beams 606. In this embodiment, plates 611a-c are general wave plates that can be used to adjust the phase of the beams 606. In one configuration, plates 611 a-c consist of half wave plates with some attenuation that are adapted to rotate the phase of the beams 606 by about 180° and to reduce the intensity of the zeroth non-diffracted order. With such a configuration, it is possible to approximate the action of an attenuated phase shift mask and to provide more depth of focus. Plates 611a-c may be in communication with a controller 620 that is configured to insert or withdraw the plates 611a-c in and out of the radiation path. In an embodiment, an attenuator plate can be positioned along the optical path of the lithographic apparatus 600 to block the zeroth diffraction order.

Figure 7:
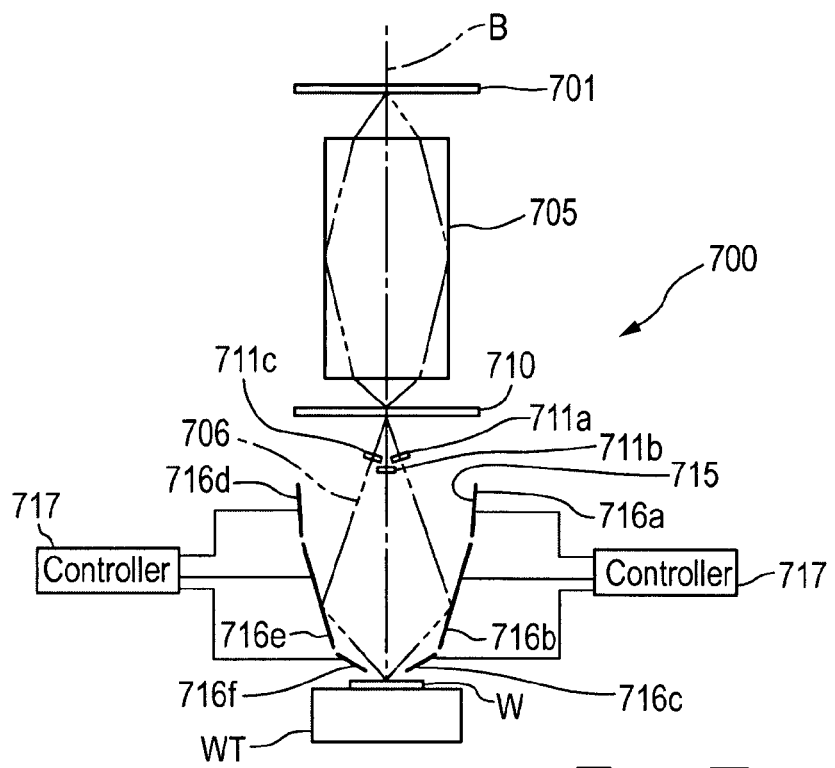
FIG. 7 schematically depicts a lithographic apparatus in accordance with an embodiment of the invention.

FIG. 7 shows a lithographic apparatus 700 in accordance with an embodiment of the invention. Similarly to the embodiment of FIG. 6, the lithographic apparatus 700 includes a first beam splitter 701, a radiation transfer device 705, a second beam splitter 710, attenuators and/or phase plates 711a-c and a beam combiner 715. Plates 711a-c may be in communication with a controller (not shown in FIG. 7) that is configured to insert or withdraw the plates 711a-c in and out of the radiation path. In FIG. 7, the beam combiner 715 includes a plurality of mirrors 716a-f that are independently moveable to redirect the plurality of beams 706 toward the surface of the substrate W. The orientation of the mirror 716a-f may be controlled with a controller 717. It will be appreciated that additional mirrors or fewer mirrors could be used in other embodiments of the invention.

Figure 8:
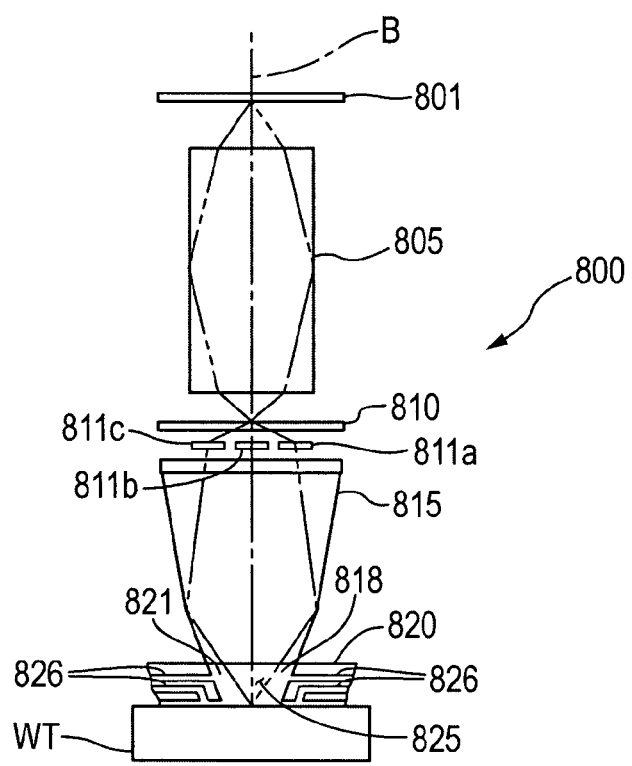
FIG. 8 schematically depicts a lithographic apparatus in accordance with an embodiment of the invention.

In an embodiment, the lithographic apparatus may be used in conjunction with an immersion liquid system. A lithographic apparatus in accordance with this embodiment is shown in FIG. 8. Similarly to FIG. 6, the lithographic apparatus 800 includes a first beam splitter 801, a radiation transfer device 805, a second grating 810, attenuators and/or phase plates 811a-c and a beam combiner 815. The lithographic apparatus 800 also includes a liquid supply system 820 arranged between the beam combiner 815 and the substrate W, which is positioned on the substrate stage WT. The liquid supply system 820 includes a reservoir 821 that is filled with liquid 825 having a relatively high refractive index, e.g., water, provided via inlet/outlet ducts 826. Since the radiation wavelength of the impinging radiation beam is shorter in liquid than in the air or in a vacuum, smaller features can be resolved. In an embodiment, liquid 825 of the liquid supply system 820 may be in contact with the bottom face 818 of the beam combiner 815.

Figure 9:
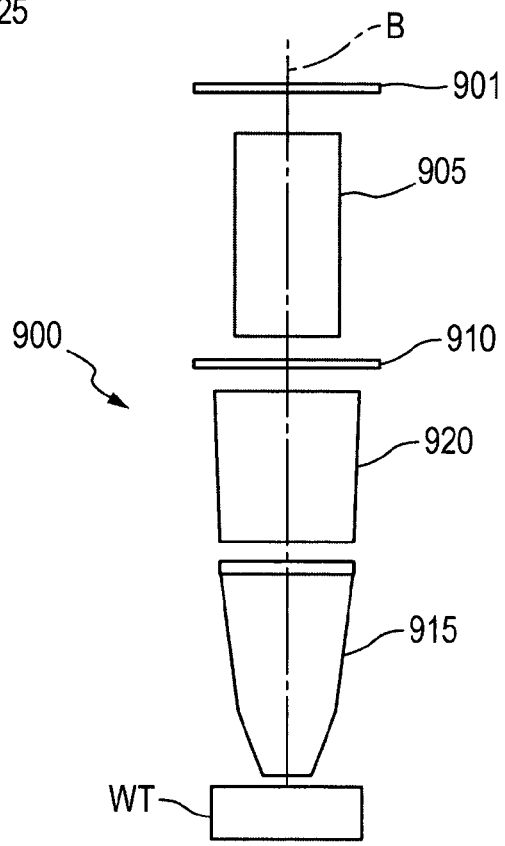
FIG. 9 schematically depicts a lithographic apparatus in accordance with an embodiment of the invention.

Referring now to FIG. 9, this figure shows a lithographic apparatus 900 in accordance with an embodiment of the invention. Similarly to FIG. 1A, the lithographic apparatus 900 includes a first beam splitter 901, a radiation transfer device 905, a second beam splitter 910, and a beam combiner 915. The lithographic apparatus 900 also includes a magnification system 920. The use of the magnification system 920 can significantly relax the pattern dimensions of the first and/or second beam splitters 901, 910. A magnification system having a magnification factor of about 10 could be used in an embodiment of the invention.

Figure 10:
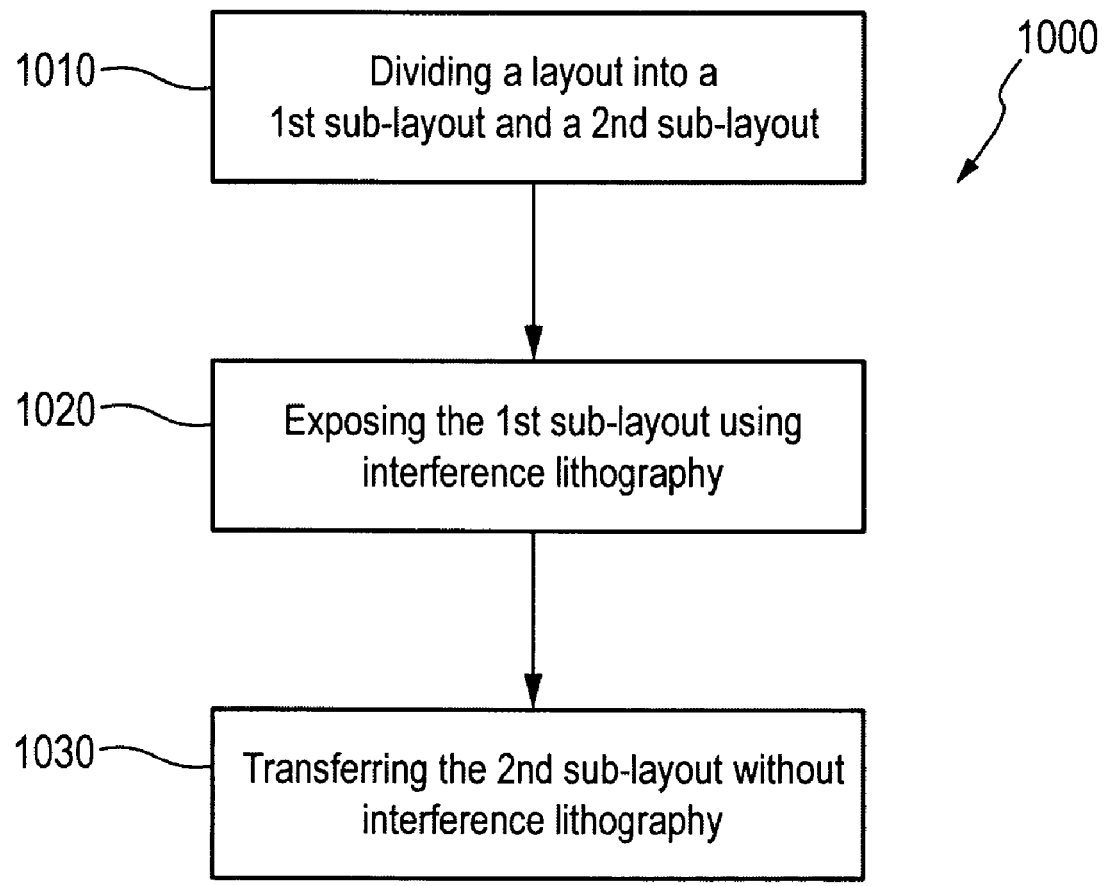
FIG. 10 shows a method for printing a pattern in accordance with an embodiment of the invention.

In an embodiment of the invention, a multiple exposure process could be used to print a desired pattern. Referring to FIG. 10, this figure shows a method for printing a desired pattern in accordance with an embodiment of the invention. The method 1000 starts at block 1010 where the layout of the pattern is divided into a first and a second sub-layout. The division of the layout is done such that the first sub-layout includes a periodic pattern and the second layout includes (a) a non periodic pattern, (b) a pattern that is different from that included in the first sub layout and/or (c) a pattern that is generally included in the periphery of the layout. The method 1000 then proceeds to block 1020 where a first exposure using interference lithography is carried out to image the first sub-layout on the substrate. The first exposure could be done using one of the lithographic apparatuses shown in FIGS. 1 and 6-9. After exposing the first sub-layout, the method proceeds to block 1030 where the second sub-layout is transferred. With the method of FIG. 10, a critical periodic pattern can be printed via interference lithography.

It will be appreciated that the order of the first exposure and the transfer of the second sub-layout could be reversed in another embodiment of the invention. In addition, it will be appreciated that the layout of the patterning device could be divided into more than two layouts. For example, in one configuration, a first sub-layout could include a first periodic pattern and a second sub-layout could include a second periodic pattern (different from the first one). In this configuration, more than three exposures or transfers can be used to image or transfer the first, second and third sub-layouts.

Figure 11:
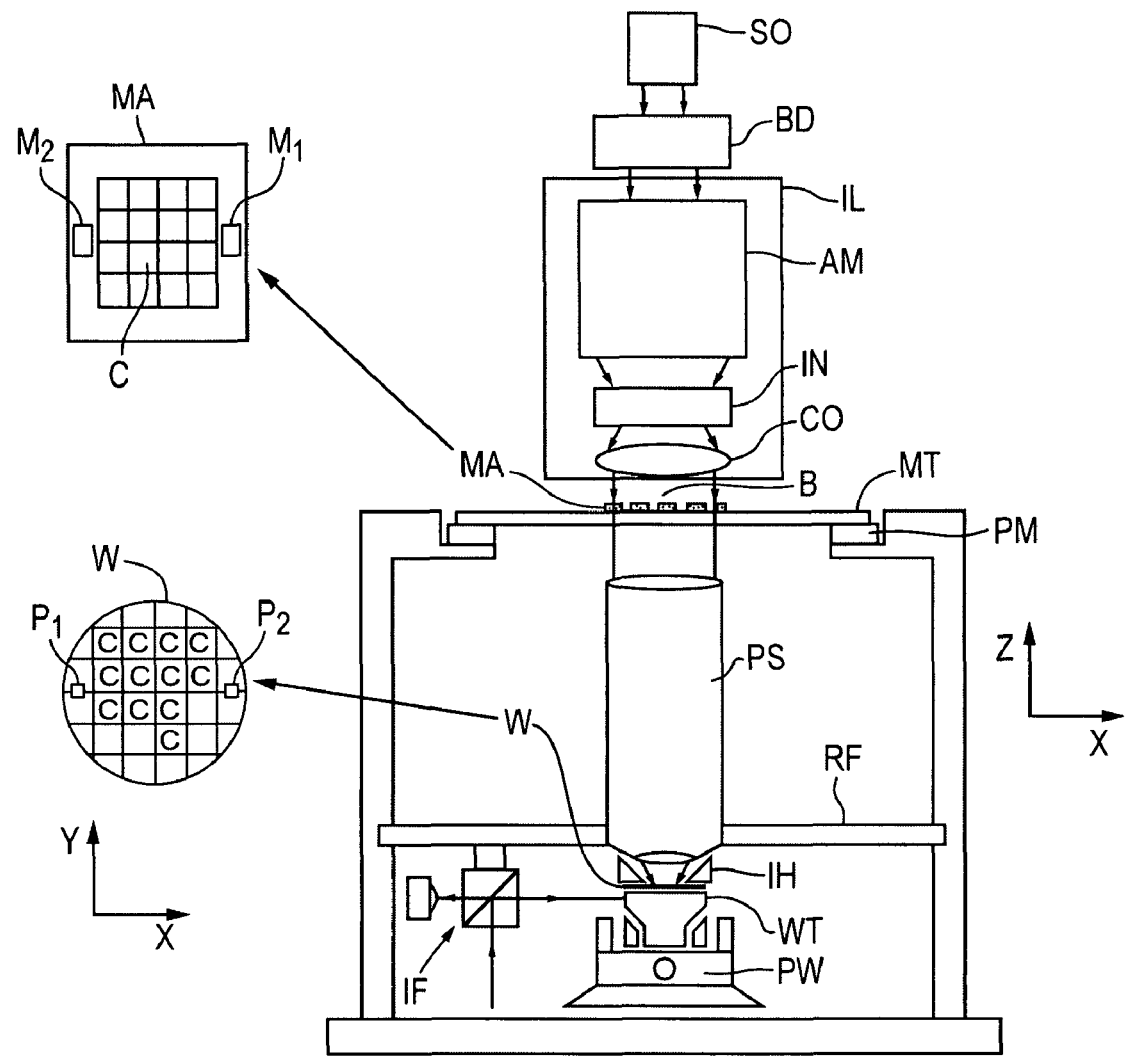
FIG. 11 schematically depicts a lithographic apparatus in accordance with an embodiment of the invention.

The transfer of the second sub-layout 1030 of FIG. 10 may be carried out with a mask-less lithographic apparatus, with a lithographic apparatus such as the one shown in FIG. 11, an imprint apparatus as described hereafter, etc.

FIG. 11 schematically depicts a lithographic apparatus according to one embodiment of the invention. The apparatus includes an illumination system (illuminator) IL configured to condition a radiation beam B (e.g., UV radiation or DUV radiation); a support structure (e.g., a mask table) MT constructed to hold a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more support structures). In such "multiple stage" machines the additional tables/support structures may be used in parallel, or preparatory steps may be carried out on one or more tables/support structure while one or more other tables/support structures are being used for exposure.

Referring to FIG. 11, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations of the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A lithographic apparatus comprising:
a first beam splitter configured to create a first plurality of spatially coherent radiation beams;
a second beam splitter configured to receive at least a portion of the first plurality of spatially coherent radiation beams and to create, based on the first plurality of spatially coherent radiation beams, a second plurality of spatially coherent radiation beams; with the first and second beam splitters are diffraction gratings,
a phase plate, an attenuator, or both a phase plate and an attenuator, configured to modify the phase, amplitude, or both the phase and amplitude, of one beam of the second plurality of spatially coherent beams relative to another of the secondary plurality of spatially coherent beams; and a beam combiner adapted to redirect and combine at least a portion of the second plurality of spatially coherent radiation beams onto a surface of a substrate to form an interference pattern,
wherein the phase plate, the attenuator, or both the phase plate and the attenuator are arranged between the second beam splitter and the beam combiner.

2. The apparatus of claim 1, wherein each of the diffraction gratings is an alternating phase shift grating or a binary grating.

3. The apparatus of claim 1, wherein each of the diffraction gratings is a one dimensional or a two dimensional grating.

4. The apparatus of claim 1, wherein the portion of the first plurality of spatially coherent beams provides an off-axis illumination for the second beam splitter.

5. The apparatus of claim 1, further comprising a radiation transfer device that is adapted to redirect the portion of the first plurality of radiation beams toward the second beam splitter.

6. The apparatus of claim 5, wherein the radiation transfer device includes a glass rod, a lens or a mirror.

7. The apparatus of claim 1, wherein the beam combiner is a multi-faceted prism.

8. The apparatus of claim 1, wherein the portion of the second plurality of spatially coherent beams includes 2, 3, 4, 6 or 8 beams.

9. The apparatus of claim 1, further comprising a magnification system arranged between the second beam splitter and the beam combiner.

10. The apparatus of claim 1, further comprising a liquid supply system arranged to provide liquid between a surface of the beam combiner and the surface of the substrate.

11. A lithographic apparatus comprising:
a first diffraction grating configured to create a first plurality of spatially coherent radiation beams;
a second diffraction grating configured to receive at least a portion of the first plurality of spatially coherent radiation beams and to create, based on the first plurality of spatially coherent radiation beams, a second plurality of spatially coherent radiation beams;
a radiation transfer device arranged between the first and the second diffraction gratings, the radiation transfer device configured to redirect the portion of the first plurality of spatially coherent radiation beams towards the second diffraction grating such that the first plurality of spatially coherent radiation beams form a coherent off-axis illumination for the second diffraction grating;
a phase plate, an attenuator, or both a phase plate and an attenuator, configured to modify the phase, amplitude, or both the phase and amplitude, of one beam of the second plurality of spatially coherent beams relative to another of the secondary plurality of spatially coherent beams; and
a beam combiner adapted to redirect and combine at least a portion of the second plurality of spatially coherent radiation beams onto a surface of a substrate to form an interference pattern,
wherein the phase plate, the attenuator, or both the phase plate and the attenuator are arranged between the second diffraction grating and the beam combiner.

12. The apparatus of claim 11, wherein each of the first and second diffraction gratings is an alternating phase shift grating or a binary grating.

13. The apparatus of claim 11, wherein each of the first and second diffraction gratings is a one dimensional or a two dimensional grating.

14. The apparatus of claim 11, wherein the portion of the first plurality of spatially coherent radiation beams form illumination poles that are substantially equidistant from an optical axis of said lithographic apparatus.

15. The apparatus of claim 14, wherein the illumination poles are aligned along two substantially perpendicular directions in a plane that is substantially perpendicular to the optical axis.

16. A device manufacturing method comprising:
   illuminating a first diffraction grating with a beam of radiation so as to form a first plurality of spatially coherent radiation beams;
   illuminating a second diffraction grating with at least a portion of the first plurality of spatially coherent radiation beams so as to form a second plurality of spatially coherent radiation beams;
   modifying the phase, amplitude, or both the phase and amplitude, of one beam of the second plurality of spatially coherent beams relative to another of the secondary plurality of spatially coherent beams; and
   subsequently redirecting and combining at least a portion of the second plurality of spatially coherent radiation beams onto a surface of a substrate so as to form an interference pattern.

17. The method of claim 16, wherein illuminating the second diffraction grating includes redirecting the portion of the first plurality of spatially coherent radiation beams formed by the first diffraction grating toward the second diffraction grating.

18. The method of claim 17, wherein the portion of the first plurality of spatially coherent radiation beams is redirected toward the second diffraction grating so as to form an off-axis illumination for the second diffraction grating.

19. The method of claim 16, wherein each of the first and second diffraction gratings is an alternating phase shift grating or a binary grating.

20. The method of claim 16, wherein each of the first and second diffraction gratings is a one dimensional or a two dimensional grating.

21. The method of claim 16, wherein the portion of the second plurality of spatially coherent radiation beams includes 2, 3, 4, 6 or 8 beams.

* * * * *